(12) United States Patent
Drews et al.

(10) Patent No.: US 6,678,171 B1
(45) Date of Patent: Jan. 13, 2004

(54) FASTENING ARRANGEMENT FOR LIGHT EMITTING DIODE METAL ARRAY

(75) Inventors: Edwin R. Drews, Anderson, IN (US); Michael W. Beeler, Anderson, IN (US); Ernest W. Robinson, Knightstown, IN (US)

(73) Assignee: Guide Corporation, Pendleton, IN (US)

( * ) Notice: Subject to any disclaimer, the term of this patent is extended or adjusted under 35 U.S.C. 154(b) by 0 days.

(21) Appl. No.: 10/279,284

(22) Filed: Oct. 24, 2002

(51) Int. Cl.$^7$ ............................................. H02B 1/01
(52) U.S. Cl. ....................... 361/825; 362/238; 362/240; 362/362
(58) Field of Search ............................... 361/726, 727, 361/753, 758, 759, 805–807, 809–811, 825; 362/18, 66, 238, 240, 257, 272, 311, 351, 367, 373, 374, 433, 362

(56) References Cited

U.S. PATENT DOCUMENTS

| | | | |
|---|---|---|---|
| 4,881,904 A | * | 11/1989 | Ammon et al. ................ 439/78 |
| 5,034,866 A | * | 7/1991 | Pujol ........................... 362/240 |
| 5,103,382 A | | 4/1992 | Kondo et al. |
| 5,436,809 A | | 7/1995 | Brassier et al. |
| 5,475,566 A | | 12/1995 | Rada et al. |
| 5,490,048 A | | 2/1996 | Brassier et al. |
| 5,528,474 A | | 6/1996 | Roney et al. |
| 5,704,708 A | * | 1/1998 | Barson et al. ............... 362/238 |
| 6,000,559 A | | 12/1999 | Stopyra et al. |
| 6,049,043 A | * | 4/2000 | Tonejc ........................ 174/250 |
| 6,074,074 A | | 6/2000 | Marcus |
| 6,158,882 A | | 12/2000 | Bischoff, Jr. |

FOREIGN PATENT DOCUMENTS

JP    6023627    2/1994

* cited by examiner

Primary Examiner—Randy Gibson
Assistant Examiner—Thanh S. Phan
(74) Attorney, Agent, or Firm—Ice Miller; Russell E. Fowler, II; Jay G. Taylor

(57) ABSTRACT

A mounting assembly for at least one array of light emitting diodes (LEDs) comprises at least one metal circuit board and mounting bracket. The circuit board has one or more LEDs attached to it and at least one first engaging opening and at least one second engaging opening formed through the circuit board. The first engaging opening is key shaped with a larger portion and a narrowed elongated portion so that engaging surfaces are formed adjacent opposite edges of the narrowed portion. The mounting bracket is formed of a electrically non-conducting material such as plastic with at least one first engaging tab and at least one second engaging tab formed thereon. The first engaging tab is configured to have a narrow portion and a larger portion connected to the outward end of the narrow portion so that there is a gap formed between the edges of the larger portion and the mounting surface. The larger portion is dimensioned to be able to be passed through the larger portion of the first engaging opening but too large to pass through the elongated narrowed portion of the first engaging opening, and the narrow portion is dimensioned to be able to fit into the elongated narrowed portion of the first engaging opening so that the larger portion of the first tab engages the engaging surfaces when the narrow portion of the first tab is moved into the elongated narrowed portion of the first engaging opening. The second engaging tab is configured and positioned to enter and engage the second engaging opening when the narrow portion of the first tab is moved into the elongated narrowed portion of the first engaging opening to lock the circuit board in position against the mounting bracket.

4 Claims, 5 Drawing Sheets

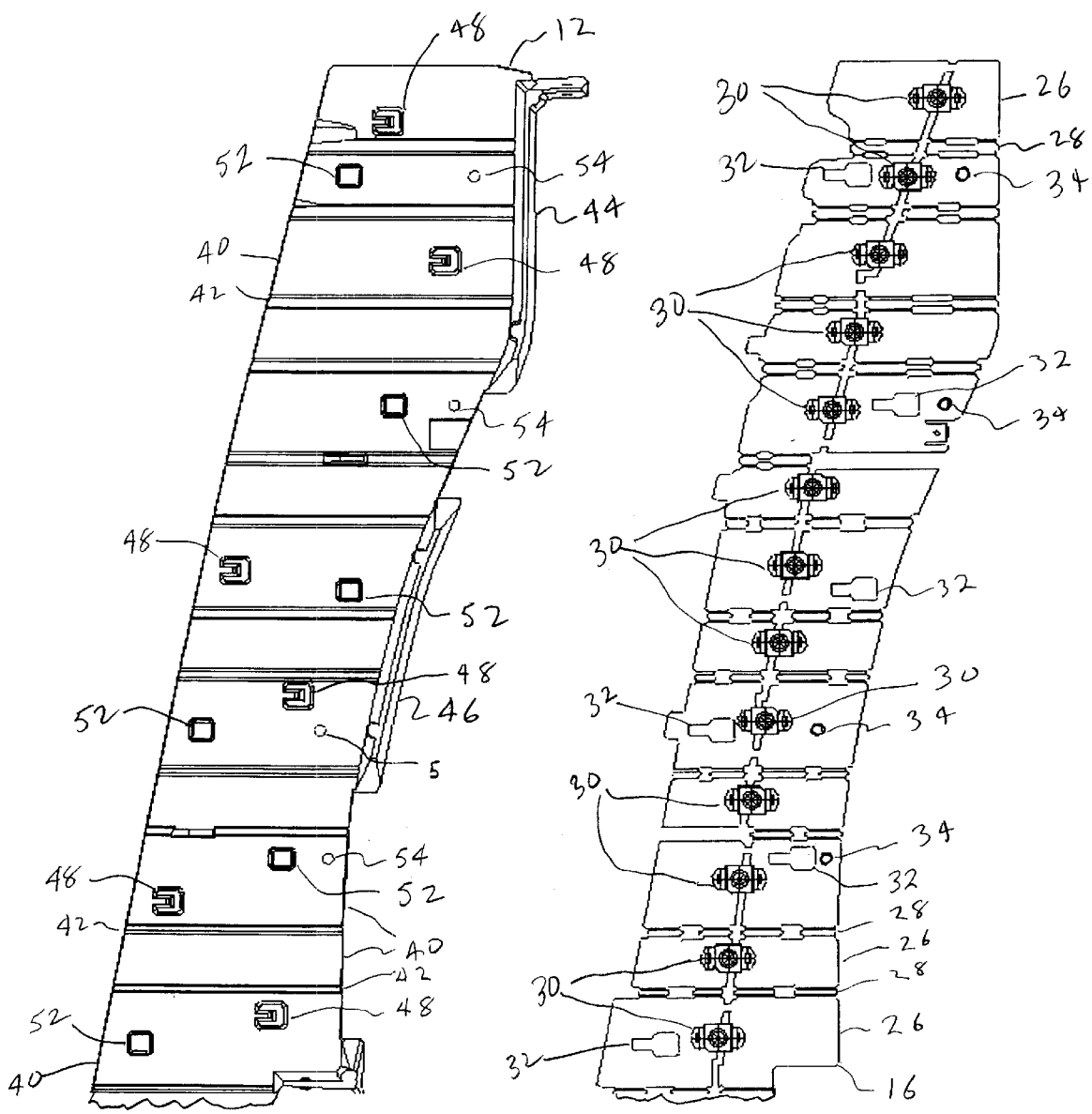

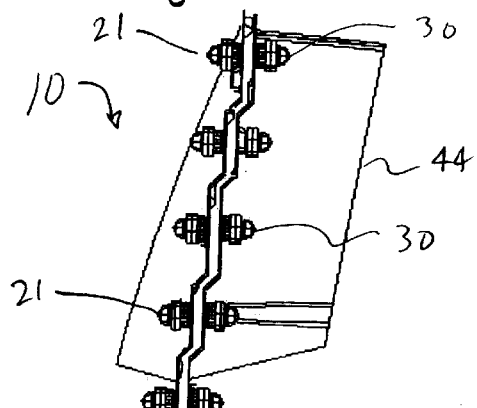
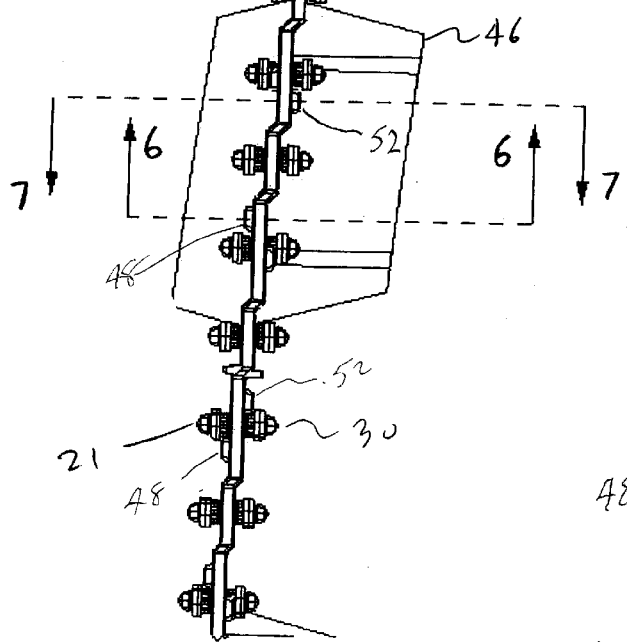
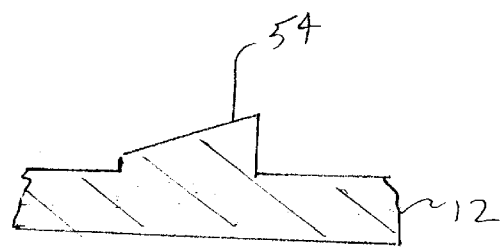
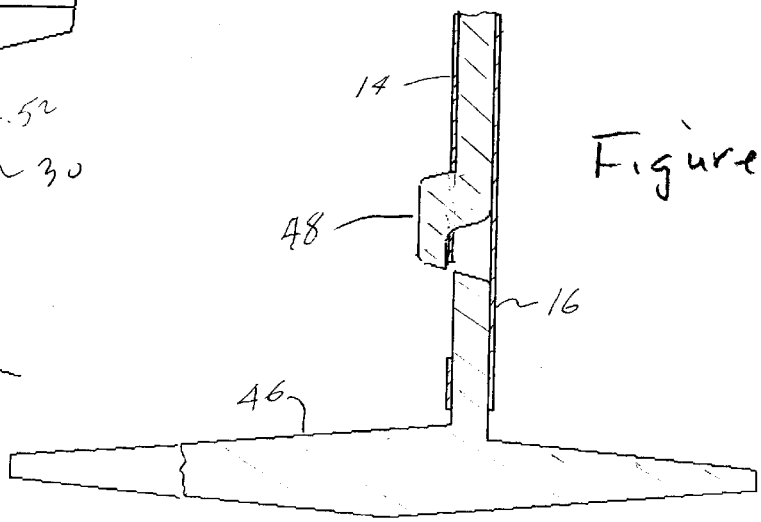

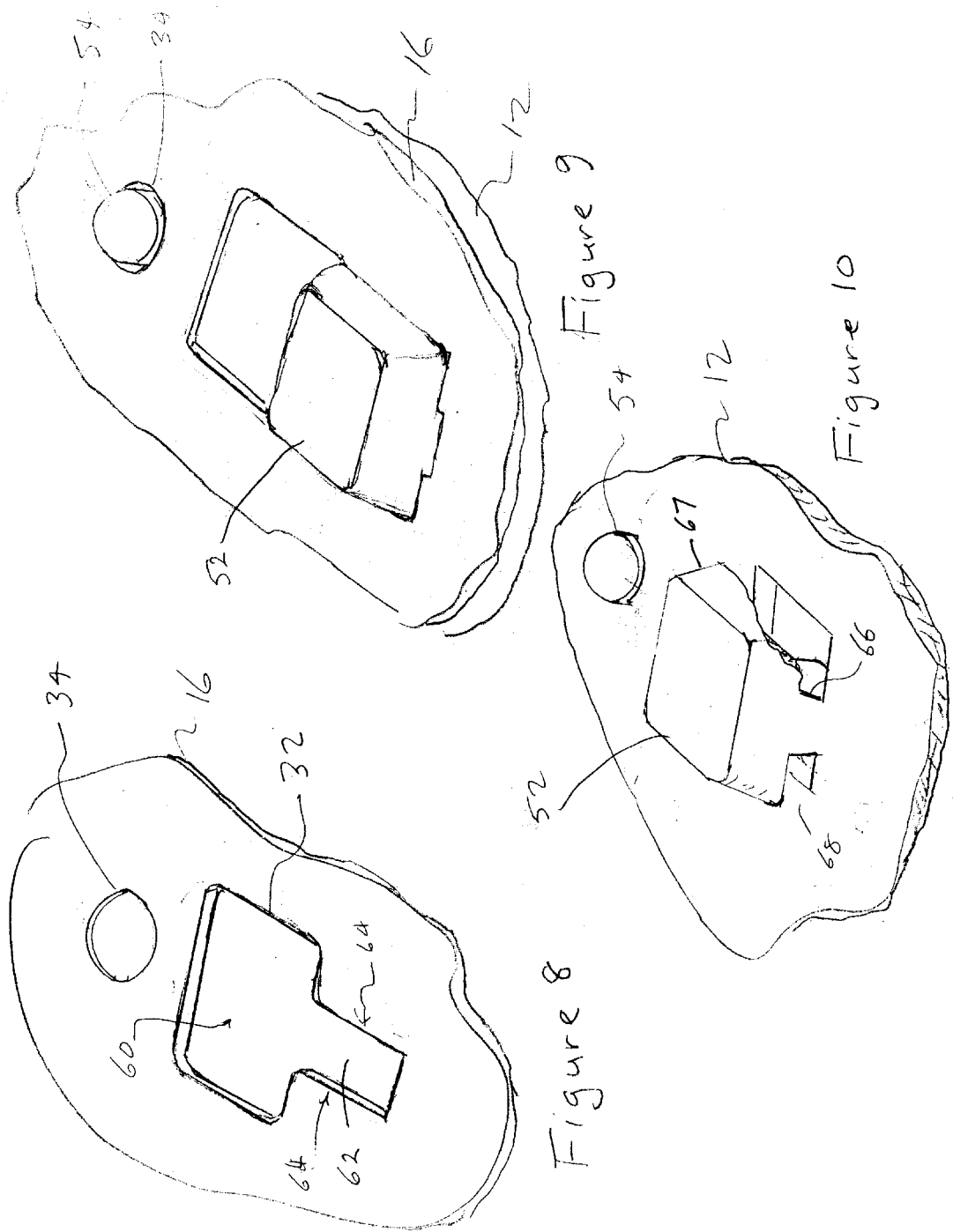

FASTENING ARRANGEMENT FOR LIGHT EMITTING DIODE METAL ARRAY

FIELD OF THE INVENTION

The present invention relates to fastening arrangements for automotive lighting fixtures and more particularly, to a means of fastening a metal array of light emitting diodes to a plastic support in a light fixture.

BACKGROUND OF THE INVENTION

Light emitting diodes are becoming more common in automotive lighting fixtures because of the amount of luminosity for their compact size, and the flexibility of their configuration in lighting arrangements. Additionally, light emitting diodes permit more artistic and aesthetically pleasing light arrays which give the automotive lighting fixture a more desirable or unique appearance.

Light emitting diodes or LEDs are special diodes that emit light when connected in an electrical circuit. The LED contains a semi-conductor chip which has two separate regions separated by a junction and when sufficient voltage is applied to the chip across the leads of the LED, current flows through the diode and light in a very narrow frequency range is emitted. The color of the light emitted can be affected by the different semi-conductor materials utilized in the LED. LEDs have certain advantages over incandescent bulbs in that they do not have a filament which will burn out and the light emitting portion does not get particularly hot, although the base portion does. They are illuminated solely by the movement of electrons in the semi-conductor material and they will last as long as a standard transistor. Thus, it is not uncommon for LEDs to have over 100,000 hours of continuous life. Consequently, LEDs are very desirable for automotive lighting fixtures where long bulb life is a desirable attribute.

One disadvantage of LEDs is that individually, they do not emit sufficient light for automotive purposes. Accordingly, it is necessary to have a number of LEDs or an array of LEDs which in combination emit sufficient light for automotive lighting purposes. However, problems have been experienced in attaching an LED array in an automotive lighting fixture. Typically, the LED array is arranged on a metallic circuit board and that metallic circuit board must be attached to the plastic of the light fixture in a manner which will assure that it remains in position and does not vibrate loose as a result of the vibration of an automobile. Accordingly, in the past, such LED arrays have been attached by screws or metal fasteners or in some instances by sonic welding. However, such prior art techniques require additional parts and labor which increase the cost of the LED lighting fixture. Accordingly, it would be a desirable advance in the art to provide a means of securely attaching LED arrays in automotive lighting fixtures which does not involve time consuming labor steps or additional parts. Accordingly, it would be an advance in the art to provide a means of securely attaching an LED array into a lighting fixture that requires no special tools and can be accomplished quickly without time consuming labor steps.

BRIEF SUMMARY OF THE INVENTION

A mounting assembly for at least one array of light emitting diodes (LEDs) comprises at least one metal circuit board and mounting bracket. The circuit board have one or more LEDs attached thereto and at least one first engaging opening and at least one second engaging opening formed through the circuit board. The first engaging opening has a larger portion and an elongated narrowed portion with engaging surfaces adjacent opposite edges of the narrowed portion. A mounting bracket is formed of a electrically non-conducting material. The mounting bracket has at least one mounting surface for receiving and supporting the circuit board. The mounting bracket has formed on the mounting surface at least one first engaging tab and at least one second engaging tab. The first engaging tab has a narrow portion extending outwardly to an outward end from the surface and a larger portion connected to the outward end of the narrow portion so that there is a gap formed between the edges of the larger portion and the mounting surface. The larger portion is dimensioned to be able to be passed through the larger portion of the first engaging opening but too large to pass through the elongated narrowed portion of the first engaging opening. The narrow portion of the first tab being dimensioned to be able to fit into the elongated narrowed portion of the first engaging opening so that the larger portion of the first tab engages the engaging surfaces when the narrow portion of the first tab is moved into the elongated narrowed portion of the first engaging opening. The second engaging tab is configured and positioned to enter and engage the second engaging opening when the narrow portion of the first tab is moved into the elongated narrowed portion of the first engaging opening to retain the circuit board in position against the mounting surface.

The larger portion of the first tab may be essentially square in shape, and the narrow portion may be essentially rectangular in shape with the rectangular dimensions less than the square dimensions of the larger portion. Also, the larger portion of the first engaging opening may be essentially square in shape and dimensioned to allow the square shaped larger portion of the first tab to pass through the square shaped larger portion opening. The elongated narrowed portion of the first opening may be essentially rectangular in shape and dimensioned to receive the rectangular shaped portion of the first tab.

Also, the second engaging tab may be essentially cylindrical in shape with a tapered upper surface upwardly tapered away from the first engaging tab. The second engaging opening may be circular in shape and positioned and dimensioned to receive the second engaging tab when the first narrow portion of the first tab is moved into the elongated narrowed portion of the first engaging opening.

Thus, the present invention provides a quick effective way of attaching a metal circuit board to a non-conductive mounting bracket that does not require special tools or fasteners.

BRIEF DESCRIPTION OF THE DRAWINGS

FIG. 2 is a side, partially fragmentary view of a mounting bracket in accordance with the present invention.

FIG. 3 is a partially fragmentary side view of an LED array in accordance with the present invention.

FIG. 5 is a top view of the combined mounting bracket and LED arrays of FIG. 1.

FIG. 6 is a cross sectional partially fragmentary view taken substantially along line 6—6 of FIG. 5.

FIG. 8 is a perspective view of the engaging openings formed in the surface of the LED array.

FIG. 9 is a perspective partially fragmentary view of the LED array of FIG. 8 with the engaging tabs of the mounting bracket engaging the openings.

FIG. 10 is a perspective partially fragmentary view of the engaging tabs of the mounting bracket.

FIG. 11 is a partially fragmentary cross sectional view of a cylindrical engaging tab in accordance with the present invention.

DETAILED DESCRIPTION OF THE INVENTION

Figure 1:
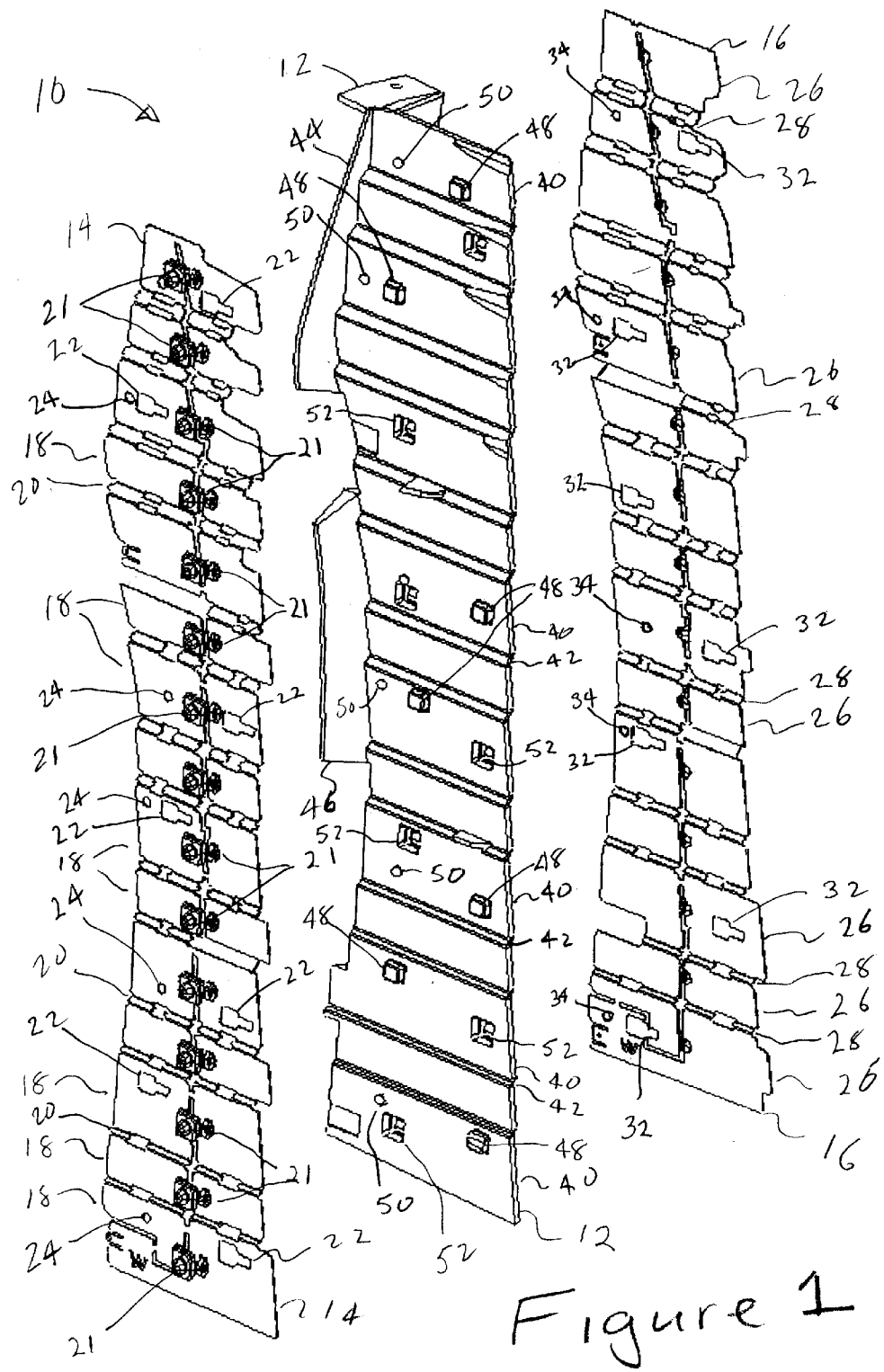
FIG. 1 is an exploded perspective view of two LED arrays and a mounting bracket in accordance with the present invention.

With reference to FIG. 1, LED mounting assembly 10 comprises a plastic mounting bracket 12, a first metal LED circuit board 14 and a second LED metal circuit board 16. Circuit board 14 is formed into a series of staggered panels 18 which are each connected by short angled walls 20. Attached to the flat faces of each of the staggered panels 20 are light emitting diodes (LEDs) 20. The LEDs 20 are electrically connected in such a manner that if electrical power is applied the entire array of LEDs will be illuminated.

Key shaped engaging openings 22 are cut through various ones of the panels 18. Also, cut through various panels 18 are round engaging openings 24.

Similarly, circuit board 16 comprises a series of staggered panels 26 each being connected to the next panel by an angled wall 28. Circuit board 16 is a reverse image of circuit board 14 and on each of the panels 26 is mounted an LED 30 (see FIG. 3). Circuit board 16 also has key shaped engaging openings 32 cut through various panels 26 and various round engaging openings 34 cut through various panels 26.

Plastic mounting bracket 12 is formed by injection molding to have individual panels 40 connected by angled walls 42. Bracket 12 also has integrally formed thereto a mounting flange 44 and a mounting flange 46. Flanges 44 and 46 allow the assembled array to be mounted within an automotive lighting fixture (not shown). The staggered panels 40 and angled walls 42 of the mounting bracket 12 are dimensioned and configured to match with the panels 18 and angled walls 20 of circuit board 14 and the panels 26 and angled walls 28 of circuit board 16 so that they can be assembled as illustrated in FIG. 5. Formed on the surface of various panels 40 of bracket 12 are first essentially square engaging tabs 48 and first semi-cylindrical engaging tabs 50. Similarly, on the opposite side of various panels 40 are formed second essential square engaging tabs 52 and second semi-cylindrical engaging tabs 54.

Figures 4, 7:
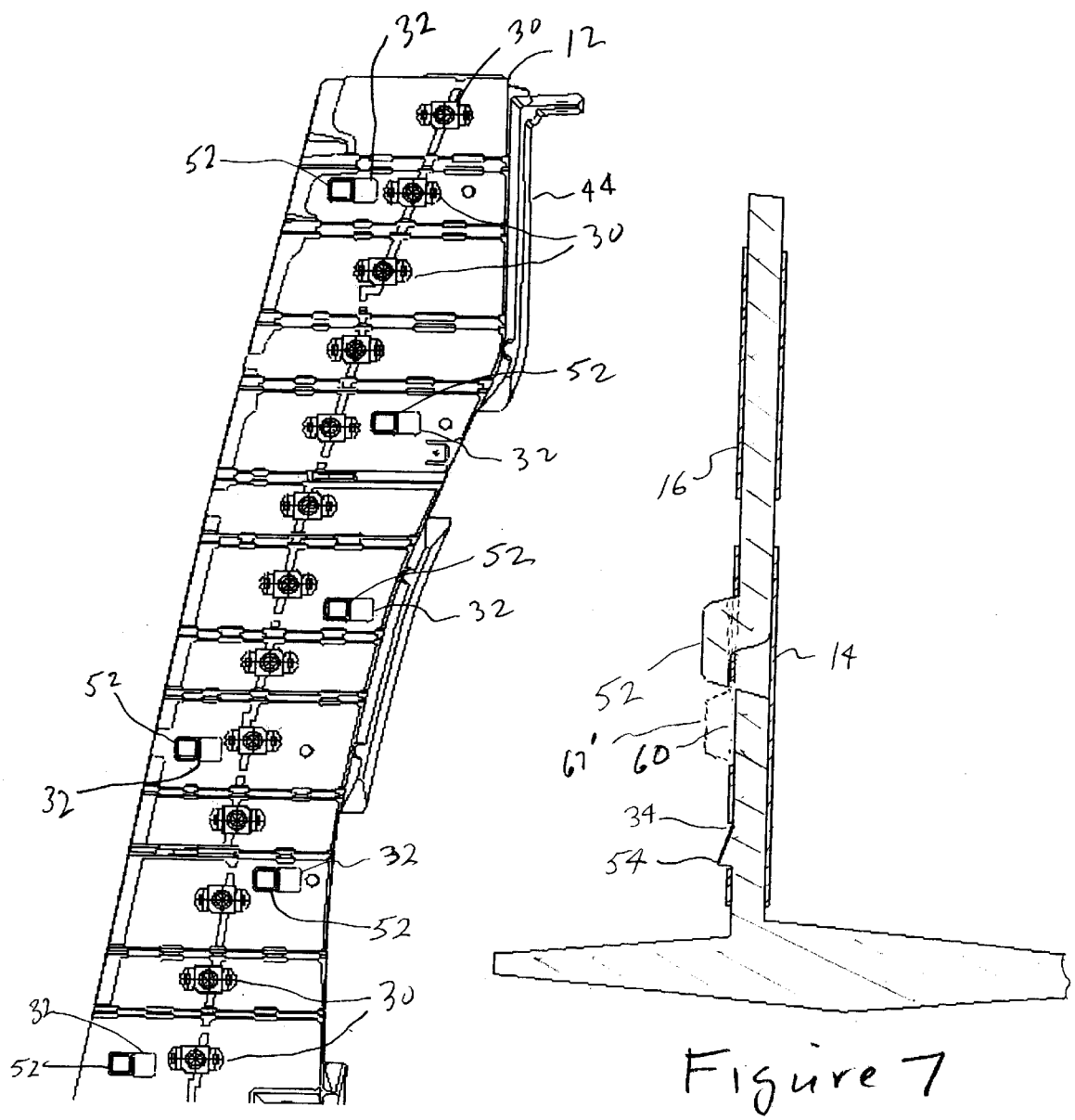
FIG. 4 is a partially fragmentary side view of the LED array of FIG. 3 attached to the mounting bracket of FIG. 2.
FIG. 7 is a cross sectional partially fragmentary view taken substantially line 7—7 of FIG. 5.

With reference to FIG. 5, an edge view of the assembled LED assembly 10 is illustrated. FIG. 4 shows a right side view of FIG. 5 and shows the engagement of second engaging tabs 52 and semi-cylindrical tabs 54 as illustrated in FIG. 7.

With reference to FIG. 8, key shaped engaging opening 32 comprises an essentially square portion 60 and a narrower elongated rectangular portion 62. Along each edge of narrower portion 62 are two engaging surfaces 64 and 66 which serve to engage the edges of larger portion 67 of second engaging tab 52 as will be explained in more detail below. With reference to FIG. 10, rectangular engaging tab 52 is integrally formed to the plastic mounting bracket 12 and extends upwardly from the surface of mounting bracket 12. Tab 52 comprises an essentially rectangular shaped leg portion 66 which extends outwardly from the surface of bracket 12. Larger square shaped portion 67 of tab 52 is formed on the outward end of leg portion 66 so that a gap 68 is formed between the surface of bracket 12 and the undersurface of larger portion 67 of engaging tab 52. Gap 68 is wide enough to allow circuit board 16 to slide beneath it as illustrated in FIG. 9. Also formed on the surface of bracket 12 is a semi-cylindrical tab 54 which has an upper surface which is tapered or sloped upwardly away from tab 52. Tab 54 is dimensioned and arranged to engage opening 34 when engaging tab 52 is inserted through the square opening 60 and then moved so that the leg 66 is fully moved into rectangular portion 62 of opening 32. When the engaging tab 52 is positioned so that leg portion 66 is against the end surface of rectangular portion 62 of opening 32, tab 54 will extend into opening 34 thereby locking circuit board 16 to bracket 12. Tabs 52 and 54 and openings 22 and 24 of circuit board 14 are similarly configured.

To assemble the circuit boards 14 and 16 to the mounting bracket 12, the parts are aligned essentially as illustrated in FIG. 1 so that the respective openings 22 in circuit board 14 will align with the corresponding square engaging tabs 48 and the openings 32 in circuit board 16 align with the square engaging tabs 52 on bracket 12. With reference to FIGS. 8, 9 and 10, the engaging opening 32 of circuit board 16 has an essentially square portion 60 which is dimensioned to accept the larger essentially square shaped larger portion 67 of engaging tab 52 when the circuit board 16 is pressed against bracket 12. With reference to FIG. 7, essentially square shaped portion 67 is illustrated by dotted lines as it passes through square opening 60. The circuit board is then moved downwardly as illustrated in FIG. 7 until the leg portion 66 is moved into narrow portion 62 of opening 32 so that the engaging surfaces 64 engage the bottom edges of tab 52 adjacent leg 66.

Once tab 52 has been fully inserted into narrow portion 62 of opening 32, second semi-cylindrical engaging tab 54 will be positioned so that it extends into round engaging opening 34 in circuit board 16 thereby locking the circuit board in position. The upper surface of second semi-cylindrical engaging tab 54 is tapered or sloped downwardly toward tab 52 to allow the circuit board 16 to ride over tab 54 until it engages opening 34.

Correspondingly, other semi-cylindrical engaging tabs 54 engage corresponding round openings 34 along the length of the circuit board 16 so that once the circuit board is slid into engaging position, it is locked in position and can only be removed by disengaging tabs 54 from openings 34.

In a similar manner, circuit board 14 can be attached to bracket 12 by inserting tabs 48 into openings 22 and then sliding the circuit board until round tabs 50 engage round openings 24 in circuit board 14.

Once assembled, the complete assembly 10 can be mounted in the interior of an automotive lighting fixture (not shown) and enclosed with a lens (not shown) so that it can be assembled onto an automobile.

It should be appreciated that various alterations, modifications and changes may be made to the preferred embodiment disclosed herein without departing from the spirit and scope of the present invention as defined in the appended claims.

What is claimed is:

1. A mounting assembly for at least one circuit array of light emitting diodes (LEDs) comprising:

at least one metal circuit board, said circuit board having one or more LEDs attached thereto and having at least one first engaging opening and at least one second engaging opening formed through said circuit board, said first engaging opening having a larger portion and an elongated narrowed portion with engaging surfaces adjacent opposite edges of said narrowed portion;

a mounting bracket formed of a electrically non-conducting material, said mounting bracket having at least one mounting surface for receiving and supporting said circuit board, and said mounting bracket having formed on said mounting surface at least one first engaging tab and at least one second engaging tab, said first engaging tab having a narrow portion extending outwardly from said mounting surface to an outward end and a larger portion connected to said outward end of said narrow portion so that there is a gap formed between edges of said larger portion and said surface, said larger portion being dimensioned to be able to be passed through said larger portion of said first engaging opening but too large to pass through said elongated narrowed portion of said first engaging opening, said narrow portion of said first tab being dimensioned to be able to pass into said elongated narrowed portion of said first engaging opening so that said larger portion of said first tab engages said engaging surfaces when said narrow portion of said first tab is moved into said elongated narrowed portion of said first engaging opening; said second engaging tabs being configured and positioned to enter and engage said second engaging opening when said narrow portion of said first tab is moved into said elongated narrowed portion of said first engaging opening to retain said circuit board in position against said mounting surface.

2. A mounting assembly as claimed in claim 1, wherein said larger portion of said first tab is essentially square in shape, and said narrow portion of said first tab is essentially rectangular in shape with rectangular dimensions being less than the square dimensions of said larger portion, and wherein said larger portion of said first engaging opening is essentially square in shape and dimensioned to allow said square shaped larger portion of said first tab to pass through said square shaped larger portion of said first engaging opening, and said elongated narrowed portion of said first engaging opening is essentially rectangular in shape and dimensioned to receive said rectangular shaped portion of said first tab.

3. A mounting assembly as claimed in claim 1 and 2, wherein said second engaging tab is essentially cylindrical in shape with a tapered upper surface upwardly sloped away from said first engaging tab, and said second engaging opening is circular in shape and positioned and dimensioned to receive said second engaging tab when said first narrow portion of said first tab is moved into said elongated narrowed portion of said first engaging opening.

4. A mounting assembly as claimed in claims 1, 2 and 3 wherein said mounting bracket is formed of plastic material.

* * * * *